United States Patent
White

(10) Patent No.: US 10,742,205 B1
(45) Date of Patent: Aug. 11, 2020

(54) SYSTEM AND METHOD FOR PROLONGING THE LIFE OF SWITCHING COMPONENTS

(71) Applicant: Advanced Energy Industries, Inc., Fort Collins, CO (US)

(72) Inventor: Harley White, Fort Collins, CO (US)

(73) Assignee: Advanced Energy Industries, Inc., Fort Collins, CO (US)

(*) Notice: Subject to any disclaimer, the term of this patent is extended or adjusted under 35 U.S.C. 154(b) by 0 days.

(21) Appl. No.: 16/571,958

(22) Filed: Sep. 16, 2019

(51) Int. Cl.
| | | |
|---|---|---|
| *H03K 17/08* | (2006.01) | |
| *H03K 17/14* | (2006.01) | |
| *H02M 1/08* | (2006.01) | |
| *H02M 1/00* | (2006.01) | |

(52) U.S. Cl.
CPC .............. *H03K 17/14* (2013.01); *H02M 1/08* (2013.01); *H03K 17/08* (2013.01); *H02M 2001/0009* (2013.01); *H03K 2017/0806* (2013.01)

(58) Field of Classification Search
CPC ................. H03K 17/14; H03K 17/145; H03K 2017/0806
USPC .......................................... 327/108–112, 378
See application file for complete search history.

(56) References Cited

U.S. PATENT DOCUMENTS

| | | | | |
|---|---|---|---|---|
| 4,700,046 A | * | 10/1987 | Fristedt | A47C 7/748 165/41 |
| 6,137,668 A | * | 10/2000 | Feldtkeller | H03K 17/0822 361/103 |
| 6,770,985 B2 | * | 8/2004 | Yabe | H02H 5/044 307/117 |

\* cited by examiner

*Primary Examiner* — Tomi Skibinski
(74) *Attorney, Agent, or Firm* — Neugeboren O'Dowd PC

(57) ABSTRACT

Systems and methods for operating switches of a power supply are disclosed. The method includes generating power with a power source and switchably coupling the power source to an output of the power supply. One or more switches are opened and closed to generate a voltage waveform at the output, and in addition, the one or more switches are opened and closed to reduce a temperature differential that occurs between a low temperature and a high temperature of each switch by increasing the low temperature of each switch.

18 Claims, 11 Drawing Sheets

SYSTEM AND METHOD FOR PROLONGING THE LIFE OF SWITCHING COMPONENTS

BACKGROUND

Field

The present embodiments relate generally to switch-mode power supplies, and more specifically to prolonging the life of switching components in switch mode power supplies.

Background

Switching devices such as filed effect transistors (FETs) and insulated gate bipolar transistors (IGBTs) are commonly used in a variety of different switch-mode power supplies. These types of switching devices are prone to fail prematurely when subjected to repetitive thermal cycles.

For example, short bursts of alternating hot and cool junction temperatures, caused by short repetitive bursts of output power, causes thermal expansion and contraction in bond wires and attachment points of the switching devices.

Increasing power levels that are anticipated in future switch-mode power supplies will only exacerbate the thermal differential experienced by the switching devices. As a consequence, existing and future switch-mode power supplies are prone to premature failure.

SUMMARY

An aspect may be characterized as a thermally managed power supply that includes a power source, an output port configured to couple to an electrical load, and one or more switches coupled to the power source and the output port. A waveform controller is configured to open and close one or more switches to generate a voltage waveform at the output port, and a thermal controller is configured to open and close the one or more switches to reduce a temperature differential that occurs between a low temperature and a high temperature of each switch by increasing the low temperature of each switch.

Another aspect may be characterized as a method for operating a power supply that includes generating power with a power source, switchably coupling the power source to an output of the power supply, and opening and closing one or more switches to generate a voltage waveform at the output port. In addition, the one or more switches are also opened and closed to reduce a temperature differential that occurs between a low temperature and a high temperature of each switch by increasing the low temperature of each switch.

Yet another aspect may be characterized as a thermally managed power supply that includes a power source, an output port configured to couple to an electrical load, and one or more switches coupled to the power source and the output port. A waveform controller is configured to open and close one or more switches to generate a voltage waveform at the output port. The power supply also includes means for heating the one or more switches to reduce a temperature differential that occurs between a low temperature and a high temperature of each switch by increasing the low temperature of each switch.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Figure 1:
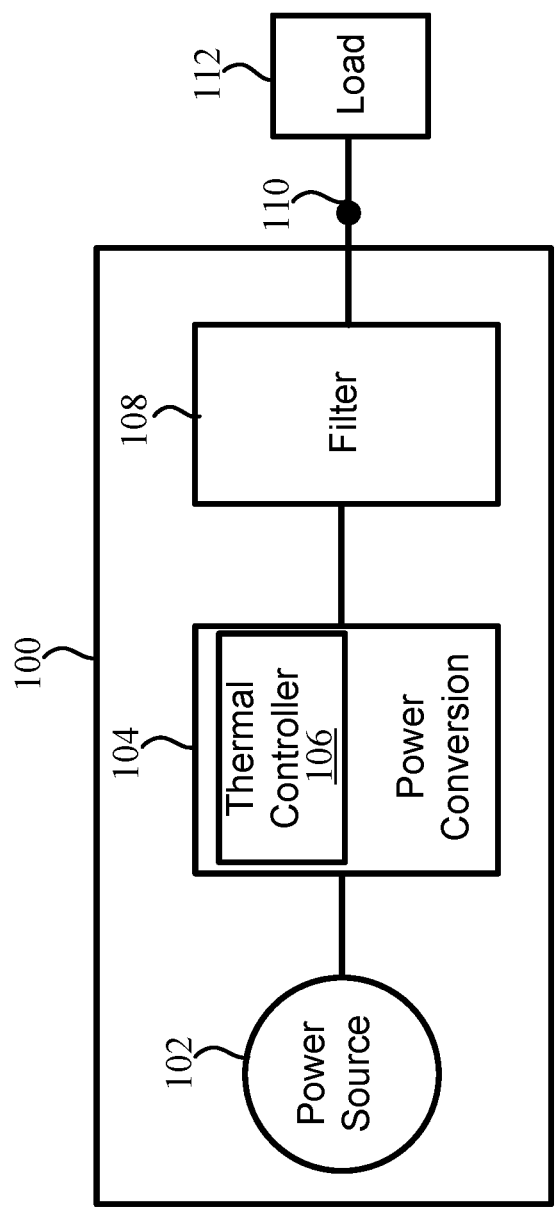
FIG. 1 is a block diagram depicting an exemplary thermally managed power supply.

Referring first to FIG. 1, shown is a block diagram depicting an exemplary thermally managed power supply 100. As shown, the thermally managed power supply 100 includes a power source 102 coupled to a power conversion component 104, and the power conversion component 104 is coupled to an output port 110 via a filter 108. As shown, the output port 110 may be coupled to a load 112, which may be any of a variety of loads including, without limitation, a plasma load. Also shown in FIG. 1 is a thermal controller 106 that functions as a part of the power conversion component 104.

The depicted power source 102 generally represents a source of power that may be AC or DC power. The power conversion component 104 generally represents a portion of the power supply 100 that includes semiconductor switches such as FETS and/or IGBTs that operate in a switch-mode of operation to convert the power into one form of power into another form of power. As used herein, the term "switch" is intended to refer to switches (such as semiconductor switches) that are prone to temperature swings during inconsistent operation. As discussed further herein, the power conversion component 104 may include a single switch, may include two switches, or may include multiple switches. As one of ordinary skill in the art will appreciate in view of this disclosure, the switches may be arranged in a variety of topologies to perform a variety of functions. For example, a single switched may be arranged in many configurations in connection with other electric components, and multiple switches may be arranged in, for example without limitation, half bridge configurations, full bridge configurations, complex interleaved arrangements, and cascade arrangements.

Moreover, the power conversion component 104 may have any of a variety of functions including: a step-down convertor (also known as a buck converter) to step down a voltage from a higher level to a lower level; a step-up convertor (also known as a boost converter) to step up a voltage from a lower level to a higher level; an inverter to convert DC power to AC power; an active rectifier to convert AC power to DC power; or a flyback converter. As a specific example, the power conversion component 104 may function to convert power from the power source 102 into pulsed power that is applied to the output port 110, but the power conversion component 104 may potentially produce any type of time varying voltage waveform.

When a typical semiconductor switch is operating (e.g., to allow conduction of current between a drain and source of the switch, there is energy loss that occurs due to the current flowing through the junction between the drain and source. As a consequence, the junction of the semiconductor switch becomes very hot, and hence, bond wires, dye, substrate, and the packaging (in thermal connection with the junction) also become hot. Moreover, a backplate of the switch and any heat sink connected thereto are also prone to becoming hot.

But when the switch is operated intermittently such that the switch is able to cool between periods where the switch is actively operating (and heating), the switch (and thermally coupled components) are prone to contracting when the switch cools and then expanding when the switch heats again. The expansion and contraction of the constituent components of the switch (and components thermally coupled thereto) causes mechanical stresses. Overtime, the accumulative effect of these repetitive mechanical stresses will substantially increase the likelihood that the components will break, crack, or detach.

To mitigate against deleterious effects of expansion and contraction, the thermal management module 106 generally operates to keep the junction of the switch at a more constant temperature. More specifically, the thermal management module 106 operates the one or more switch(es) of the power conversion component 104 to increase the temperature of the switch(es) during periods when the switches are not acting to effectuate a voltage waveform at the output port 110.

This counterintuitive heating of the switch(es) results in a smaller temperature differential between: a) time periods where the switch(es) are switching to effect a voltage change at the output port 110 and b) when the switch(es) are not operating to effect voltage changes at the output port 110. The thermal controller 106 may be realized by hardware, or software in connection with hardware. In some implementations, the thermal controller 106 utilizes the same underlying hardware as other control logic of the power conversion component 104.

The depicted filter 108 generally operates to absorb high frequency AC current of the supply during an "OFF" portion of a power cycle. In other words, the filter 108 acts as a reservoir for energy (used to heat the semiconductor switches) to prevent the energy from affecting the power at the output port 110 of the power supply 100. As discussed herein, high-speed digital controls may be used to allow injection of rapid alternating current into the output filter such that very little voltage ripple will be on the output port 110.

Figure 2:
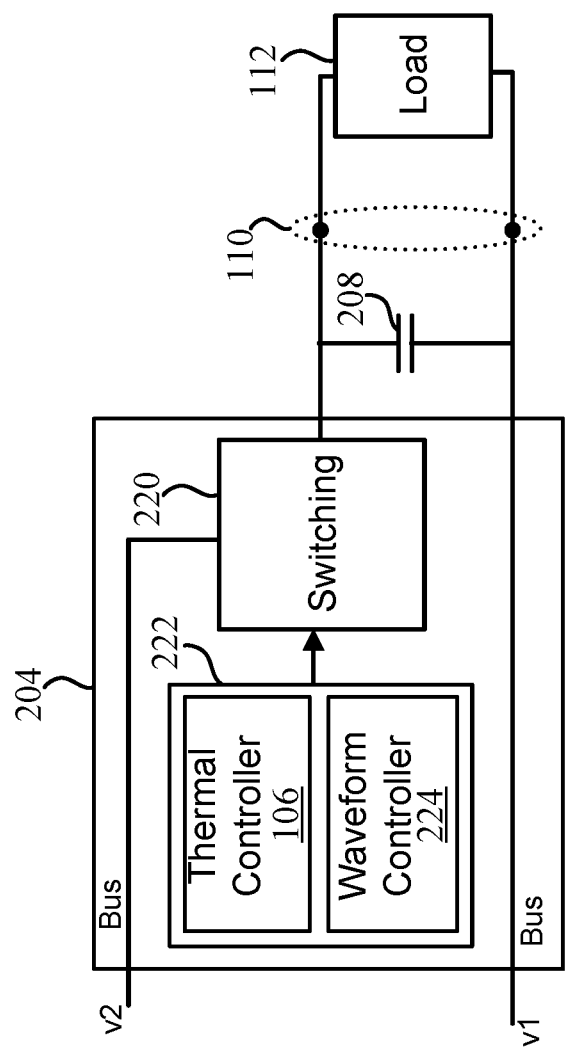
FIG. 2 is a block diagram depicting an exemplary implementation of the power conversion component depicted in FIG. 1.

Referring next to FIG. 2, shown is a block diagram depicting aspects of an exemplary power conversion component 204 that may be used to realize the power conversion component 104 depicted in FIG. 1. As shown, a control module 222 includes both a thermal controller 106 and a waveform controller 224, and the control module 222 is coupled to a switching module 220. As shown, in this embodiment the filter 108 is realized by a DC-link capacitor 208, which is positioned across the output port 110. The design of the filter 108 may vary depending upon the application and desired performance. In implementations, such as FIG. 2, where the filter 108 is realized by a capacitor 208, a size of the capacitor may also vary depending upon the application. As one example, the capacitor 208 may be realized as a 200 nanofarad capacitor, and a frequency of switching to heat the switches (w/o applying power at the output port 110) may be 200 kHz, but this is only exemplary.

The depiction of components in FIG. 2 is intended to be logical to depict functional aspects of the power conversion component 204—it is not intended to be a hardware diagram. For example, the thermal controller 106 and waveform controller 224 may share common underlying hardware (such as a processor in connection with random access memory and non-volatile memory), and in these implementations, separate non-transitory processor executable code may be used to implement the functions of the thermal controller 106 and the waveform controller 224.

The switching module 220 generally operates to switchably convert power at the input (v1, v2) of the power conversion component 204 to output power that is applied at the output port 110. As discussed above, the switching module 220 may include a single switch, may include two switches, or may include multiple switches, and the switches in the switching module 220 may be arranged in a variety of topologies to perform a variety of functions.

The waveform controller 224 generally functions to generate a voltage waveform at the output port 110 by opening and closing one or more switches as is known in the art. In contrast, the thermal controller 106 is configured to open and close the one or more switches to reduce a temperature differential that occurs between a low temperature and a high temperature of each switch by increasing the low temperature of each switch.

When the switching module 220 is realized by a single switch, the switching effectuated by the thermal controller 106 may be opening and closing a single switch in a rapid succession of short pulses that are ineffective. And when the switching module 220 includes two switches, the switching effectuated by the thermal controller 106 may include opening and closing the switches in an alternating manner to apply cancelling pulses so that the thermal controller 106 does not produce a changing voltage waveform at the output port 110.

Figure 3:
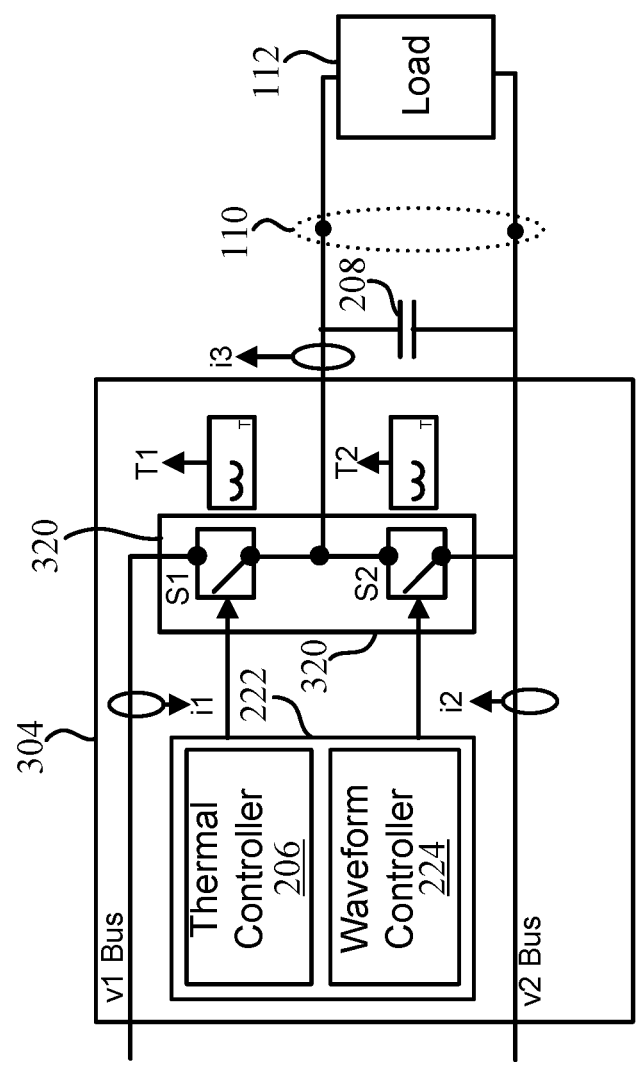
FIG. 3 is a is a block diagram depicting another exemplary implementation of the power conversion component depicted in FIG. 1.

Referring next to FIG. 3, shown is a block diagram depicting aspects of another exemplary power conversion component 304 that may be used to realize the power conversion component 104 depicted in FIG. 1. As shown, the power conversion component 304 in this embodiment 304 includes two switches S1, S2, and the controller 222 provides two drive signals—one drive signal to each of the switches S1, S2. Also shown in FIG. 3 are exemplary feedback mechanisms that may be employed to control the drive signals. As shown, some feedback mechanisms that may be employed include current transducers to sense a level of current i1, i2, i3 and/or temperature sensors positioned in thermal proximity to the switches, S1, S2 to provide temperature measurements T1, T2. One or more of the signals i1, i2, i3, T1, T2 may be fed to the controller 222 to enable the thermal controller 106 to adjust the switching (to heat the switches S1, S2) during periods of time when the switches S1, S2 are not operated by the waveform controller 224.

Figure 4:
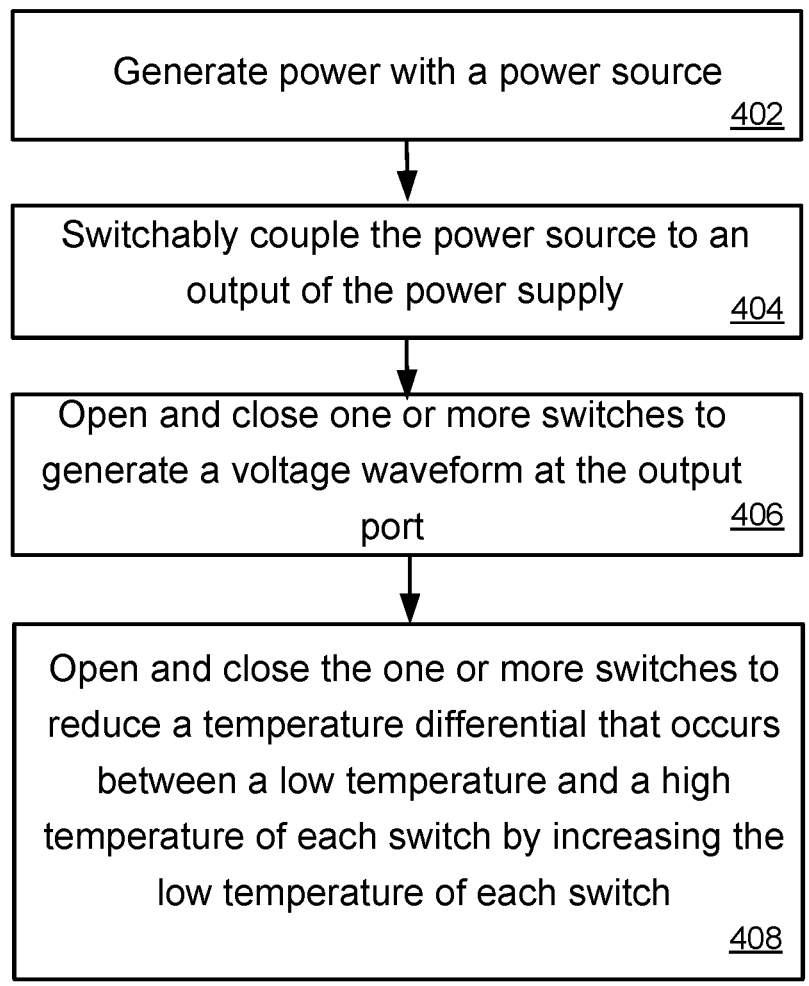
FIG. 4 is a flowchart depicting a method that may be traversed in connection with embodiments disclosed herein.
Figure 5:
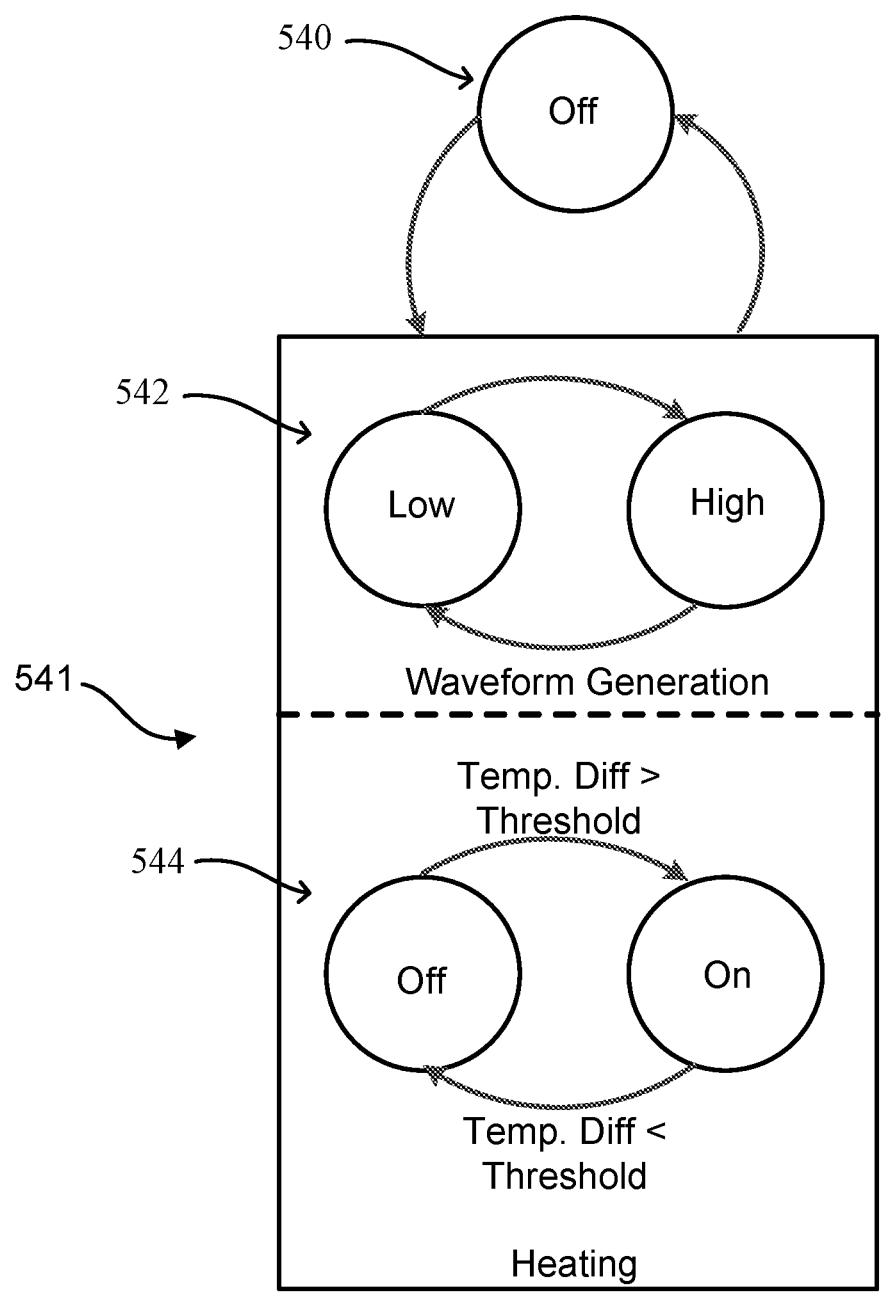
FIG. 5 is a state diagram depicting exemplary operational states of embodiments disclosed herein.

Referring next to FIG. 4, shown is a flowchart depicting a method that may be traversed in connection with embodiments disclosed herein. While referring to FIG. 4, simultaneous reference is made to FIG. 5, which is a state diagram depicting operational states of the power supply 100. As shown in FIG. 5, the power supply 100 may be completely off, and in this off state 540, the power supply is neither operating to provide an output voltage nor is it heating the switches. But when operating in one of the operational states 541 (i.e., a waveform generation state 542 or a heating state 544), power is generated with the power source 102 (Block 402). In addition, the power from the power source is switchably coupled to the output port 110 of the power supply (Block 404).

More specifically, to produce the voltage waveform at the output port 110 of the power supply 100, one or more switches in the power conversion component 104 are opened and closed in a waveform generation state 542 to generate the voltage waveform at the output port 110 (Block 406). And in a heating state 544, the one or more switches are opened and closed to reduce a temperature differential that occurs between a low temperature and a high temperature of each switch by increasing the low temperature of each switch (Block 408). In some modes of operation, the heating state 544 occurs when the temperature differential between a low temperature and a high temperature of each switch exceeds a threshold. In some implementations, the temperature of the switch(es) is directly measured by a temperature sensor and the temperature swing of the switches may be monitored to determine whether the threshold exceeds a threshold.

In other implementations, the temperature differential may be inferred based upon a measured power parameter, such as current, along with associated data that relates the measured power parameter to temperature. For example, the power supply may be operated under test conditions too obtain current readings in connection with temperature data so that measured current may be used as an indicator of a temperature differential.

It is also contemplated that the switches (and/or power conversion component 104 generally) may be empirically characterized to obtain characterization data that empirically characterizes temperature of the switches based upon operational information (e.g., set points) so that sensor data is not required to trigger entry into, and departure from, the heating state 544. In this type of implementation, the characterization data is used in a feedforward mode to trigger the heating of the switches. In yet other implementations, the thermal controller 106 may simply heat the switches whenever there is bursty operation of the power conversion component 104. Although this approach may be less optimal than using feedback or other more sophisticated approaches, it may still be possible to achieve a smaller temperature differential to lengthen a time-to-failure of the switches.

In other implementations, time may trigger the heating state when one or more switches is opened and closed to reduce a temperature differential (at Block 408). For example, if the waveform is in a low state for a predetermined amount of time (e.g., 100 ms) then heating may occur during that low state.

In yet other implementations, the heating state when one or more switches is opened and closed is carried out routinely during the low state to reduce a temperature differential (at Block 408) without being triggered by any feedback or operational information.

Figure 6:
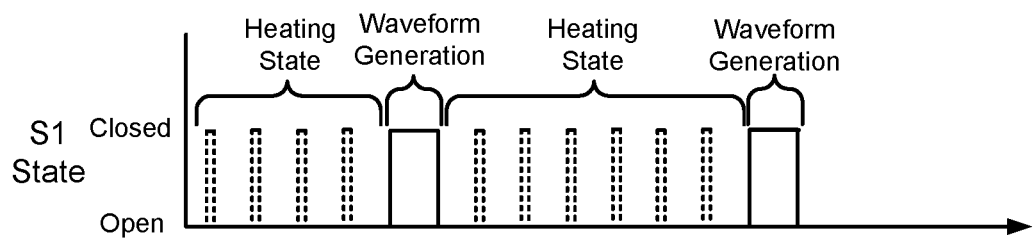
FIG. 6 is a graph depicting operation of a single switch in both waveform generation and heating states.
Figure 8:
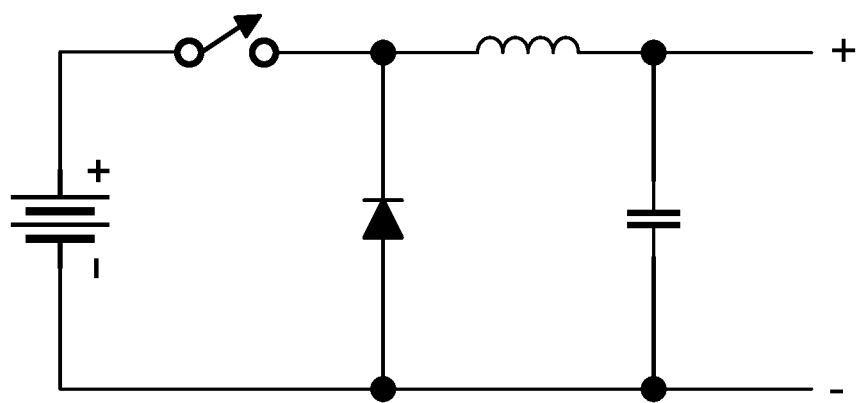
FIG. 8 depicts a step-down (buck) converter with a single switch that may operate according to the thermal control methodologies described herein.
Figure 9:
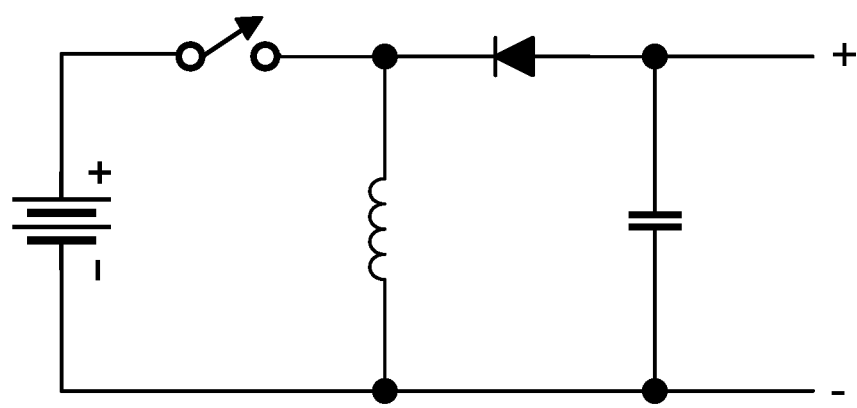
FIG. 9 depicts an inverter with a single switch that may operate according to the thermal control methodologies described herein.
Figure 10:
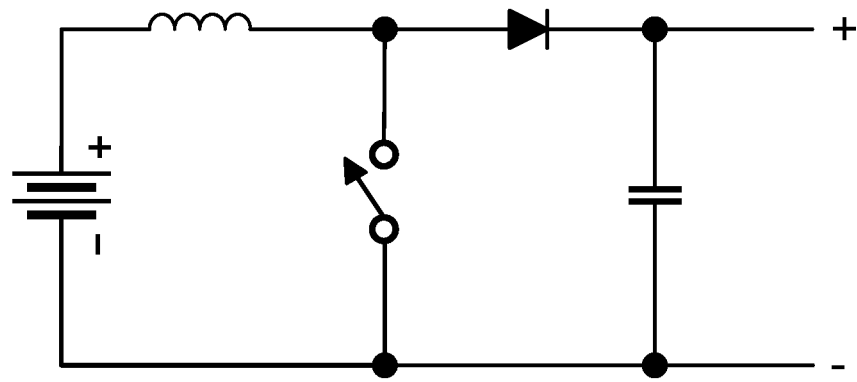
FIG. 10 depicts a step-up (boost) converter with a single switch that may operate according to the thermal control methodologies described herein.
Figure 11:
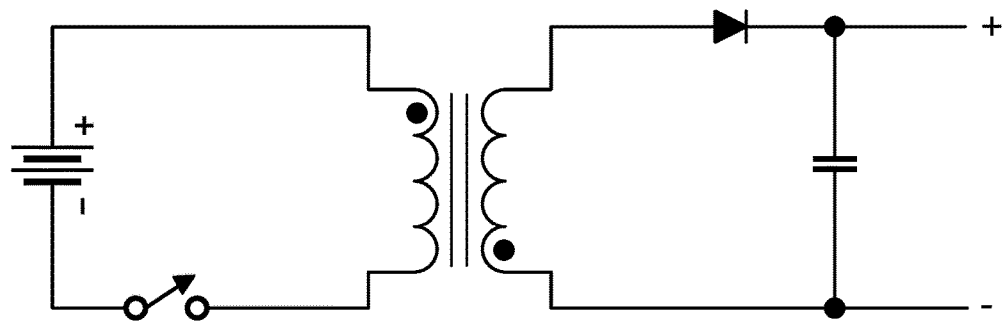
FIG. 11 depicts a flyback converter with a single switch that may operate according to the thermal control methodologies described herein.

Referring next to FIG. 6, shown is a graph depicting operation of a single switch in the heating state 544 and the waveform generation state 542. As shown, during the heating state 544 the thermal controller 106 operates to open and close the single switch in a rapid succession of short pulses that are ineffective to produce a voltage at the output port 110. Referring briefly to FIGS. 8-11, shown are exemplary single-switch embodiments of the power conversion component 104. More specifically, FIG. 8 depicts a step down (buck) converter; FIG. 9 depicts an inverter; FIG. 10 depicts a step-up boost converter; and FIG. 11 depicts a flyback converter.

Figure 15:
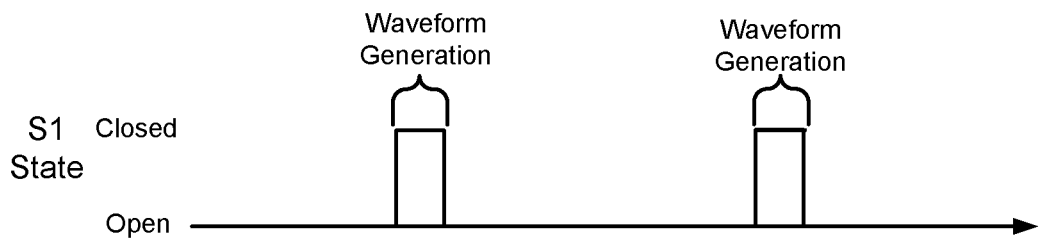
FIG. 15 is a graph depicting a prior art mode of operating a single switch.

Referring briefly to FIG. 15, shown is a graph depicting operation of a single switch consistent with the prior art. In contrast to embodiments disclosed herein (e.g., as described with reference to FIG. 6), the prior art mode of operation depicted in FIG. 15 does not open and close the one or more switches during time periods between the waveform generation state; thus, the prior art mode of operation does not reduce a temperature differential that occurs between a low temperature and a high temperature of each switch by increasing the low temperature of each switch.

Figure 7:
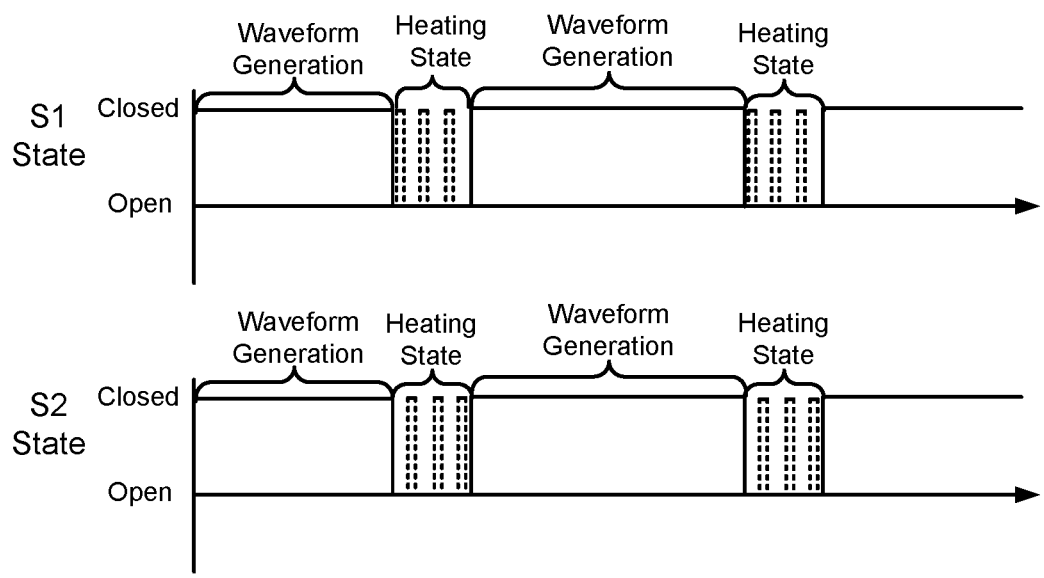
FIG. 7 are graphs depicting operation of two switches in waveform generation and heating states.

As discussed above, the approach to heating switches is applicable in multi-switch topologies. Referring to FIG. 7, shown are graphs depicting operation of two switches in the heating state 544 and the waveform generation state 542. As shown, in the heating state 544 the thermal controller 106 is configured to open and close two switches in an alternating manner to apply cancelling pulses. It should be recognized that during the depicted waveform generation time periods, the switches may be opening and closing to effectuate a voltage waveform at the output port 110, but the multiple iterations of opening and closing each switch is not depicted for clarity.

Figure 16:
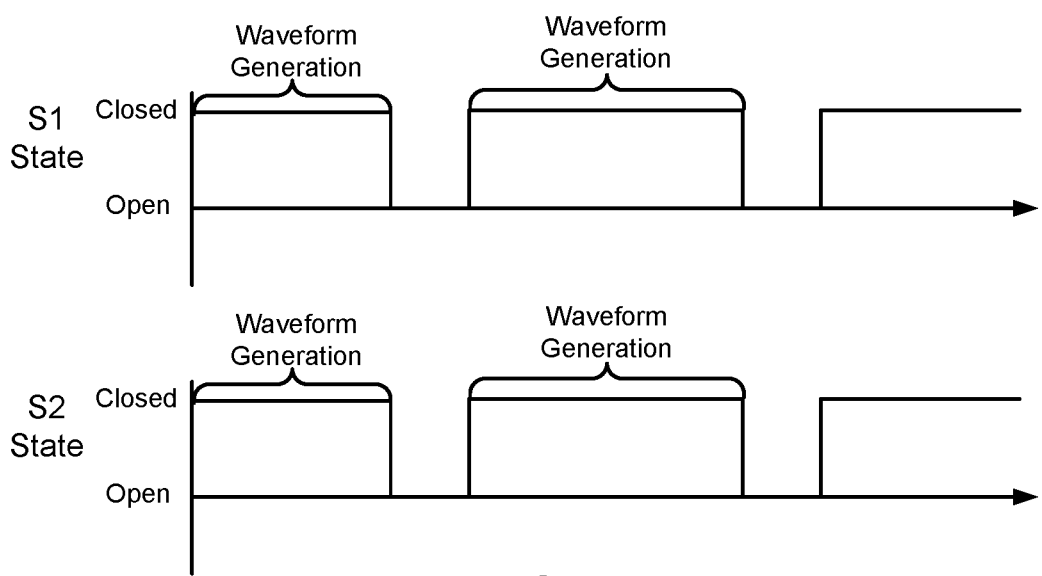
FIG. 16 is a graph depicting operation of two switches in a prior art mode of operation.

FIG. 16 is a graph that depicts operation of two switches consistent with a typical prior art mode of operation. In contrast to embodiments disclosed herein (e.g., with reference to FIG. 7), the prior art mode of operation does not operate the two switches between the waveform generation state; thus, the switches in the prior art are not opened and closed between the waveform generation state to reduce a temperature differential that occurs between a low temperature and a high temperature of each switch by increasing the low temperature of each switch.

Figure 12:
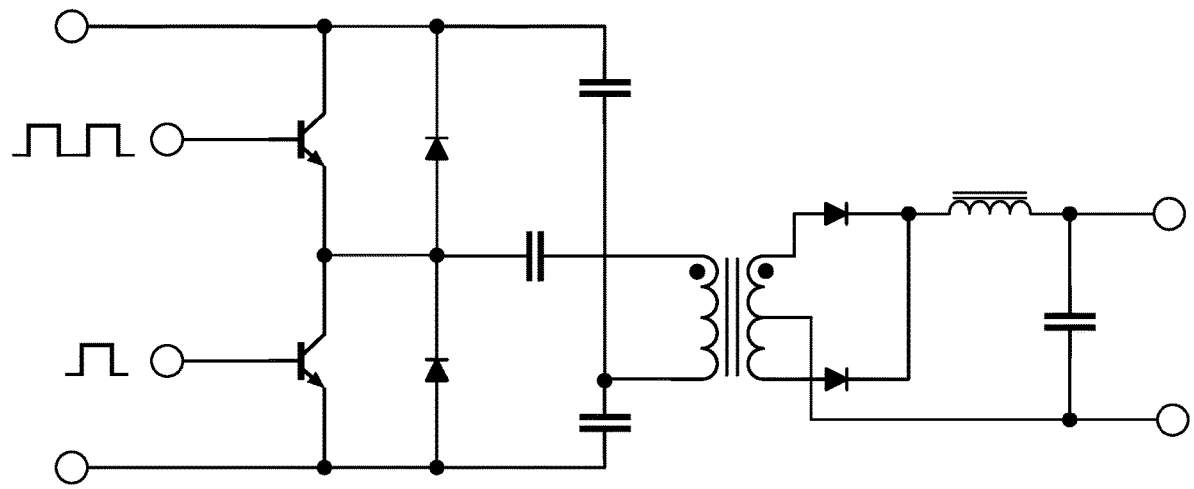
FIG. 12 is a schematic drawing of a half-bridge converter with two switches that may operate according to the thermal control methodologies described herein.

Those of ordinary skill in the art are very familiar with many topologies that include multiple switches, but FIG. 12 is one example that depicts a half-bridge converter. Other topologies are not shown, but are well known to those of ordinary skill in the art.

Figure 13:
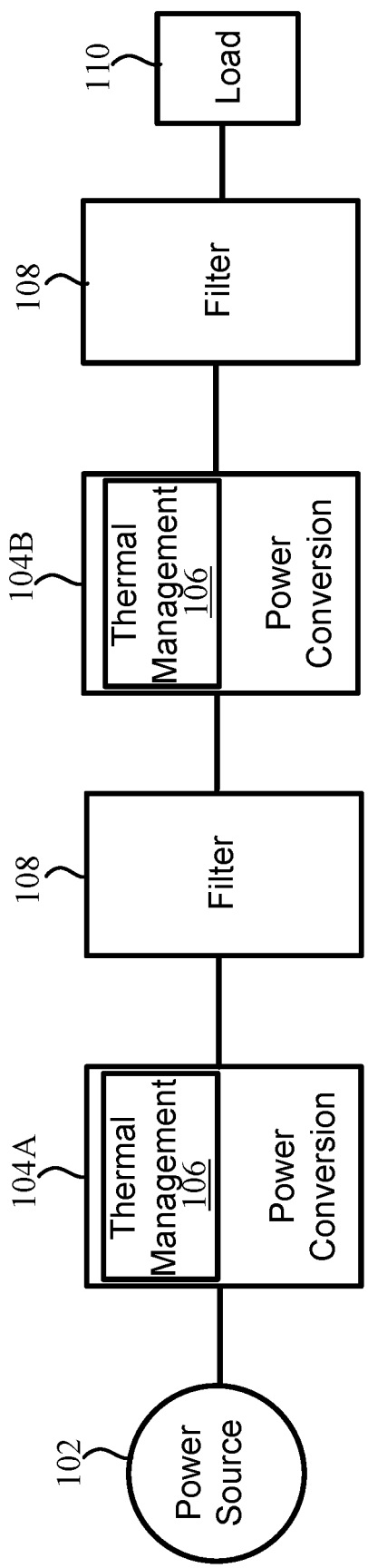
FIG. 13 is a block diagram depicting multiple power conversion stages.

Referring next to FIG. 13, shown is a block diagram illustrating multiple power conversion components 104 implemented in a power supply system. As one of ordinary skill in the art will appreciate in view of this disclosure, power supplies that include multiple stages of switch-mode power conversion may benefit from the methodologies described herein. In the arrangement depicted in FIG. 13 for example, the power source may be an AC power source, a first power conversion component 104A may operate as an active rectifier, and a second power conversion module 104B may operate as a pulsed-power power supply that operates to alternately apply bursts of power between periods of low (or no) power. In operation, the first power conversion component 104A may utilize switching in a heating state (as previously described) during rectification of the AC power and the second power conversion component 104B may utilize switching in the heating state during intermittent conversion of rectified DC power (from the first power conversion component 104A) to a time varying voltage.

Figure 14:
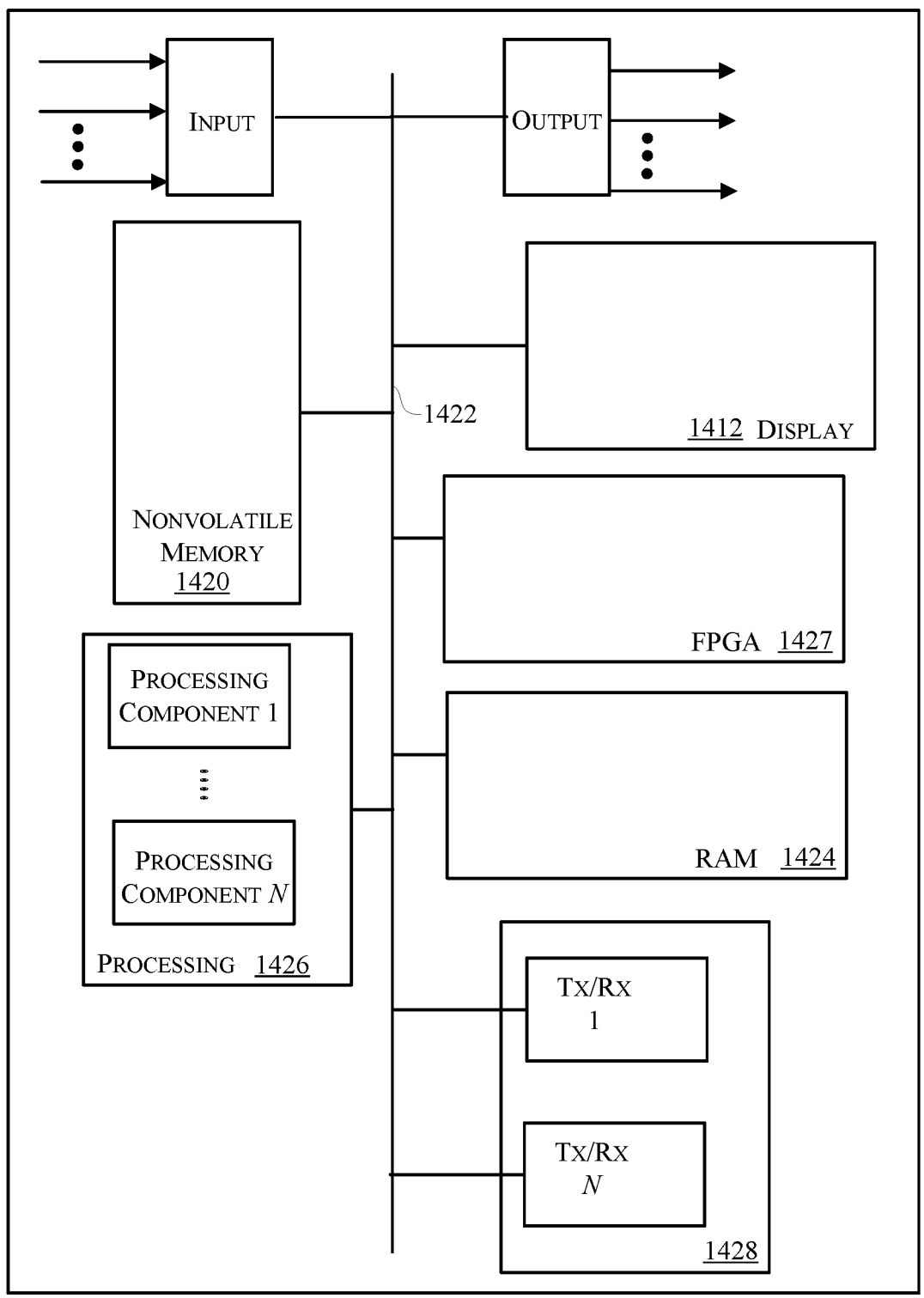
FIG. 14 is a block diagram depicting components that may be used to realize the controllers described herein.

Aspects of the present disclosure may be embodied directly in hardware, in processor executable instructions encoded in non-transitory machine readable medium, or as a combination of the two. Referring to FIG. 14 for example, shown is a block diagram depicting physical components that may be utilized to realize one or more aspects of the thermal controller 106 and the waveform controller 234 according to an illustrative embodiment of this disclosure. As shown, in this embodiment a display portion 1412 and nonvolatile memory 1420 are coupled to a bus 1422 that is also coupled to random access memory ("RAM") 1424, a processing portion (which includes N processing components) 1426, a field programmable gate array (FPGA) 1427, and a transceiver component 1428 that includes N transceivers. Although the components depicted in FIG. 14 represent physical components, FIG. 14 is not intended to be a detailed hardware diagram; thus, many of the components depicted in FIG. 14 may be realized by common constructs or distributed among additional physical components. Moreover, it is contemplated that other existing and yet-to-be developed physical components and architectures may be utilized to implement the functional components described with reference to FIG. 14.

A display 1412 generally operates to provide a user interface for a user, and in several implementations, the display 1412 is realized by a touchscreen display. For example, display 1412 can be used to control and interact with the thermal controller 106 to establish thresholds for entering the heating state 544. In general, the nonvolatile memory 1420 is non-transitory memory that functions to store (e.g., persistently store) data and machine readable (e.g., processor executable) code (including executable code that is associated with effectuating the methods described herein). In some embodiments, for example, the nonvolatile memory 1420 includes bootloader code, operating system code, file system code, and non-transitory processor-executable code to facilitate the execution of the methods described herein.

In many implementations, the nonvolatile memory 1420 is realized by flash memory (e.g., NAND or ONENAND memory), but it is contemplated that other memory types may be utilized as well. Although it may be possible to execute the code from the nonvolatile memory 1420, the executable code in the nonvolatile memory is typically loaded into RAM 1424 and executed by one or more of the N processing components in the processing portion 1426.

In operation, the N processing components in connection with RAM 1424 may generally operate to execute the instructions stored in nonvolatile memory 1420 to realize the functionality of the thermal controller 106 and waveform controller 224. For example, non-transitory processor-executable instructions to effectuate the methods described herein may be persistently stored in nonvolatile memory 1420 and executed by the N processing components in connection with RAM 1424. As one of ordinary skill in the art will appreciate, the processing portion 1426 may include a video processor, digital signal processor (DSP), graphics processing unit (GPU), and other processing components.

In addition, or in the alternative, the field programmable gate array (FPGA) 1427 may be configured to effectuate one or more aspects of the methodologies described herein (e.g., the methods described with reference to FIG. 4). For example, non-transitory FPGA-configuration-instructions may be persistently stored in nonvolatile memory 1420 and accessed by the FPGA 1427 (e.g., during boot up) to configure the FPGA 1427 to effectuate the functions of the thermal controller 106 and the waveform controller 224.

The input component may operate to receive signals (e.g., from current and/or temperature sensors described with reference to FIG. 3) that are indicative of a temperature of the switch(es). The output component generally operates to provide one or more analog or digital signals (e.g., to prompt drive signals to the switch(es)) to effectuate an operational aspect of the power conversion component 104.

The depicted transceiver component 1428 includes N transceiver chains, which may be used for communicating with external devices (e.g., external controllers) via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A thermally managed power supply comprising:
   a power source;
   an output port configured to couple to an electrical load;
   one or more switches coupled to the power source and the output port;
   a waveform controller configured to open and close one or more switches to generate a voltage waveform at the output port; and
   a thermal controller configured to open and close the one or more switches to reduce a temperature differential that occurs between a low temperature and a high temperature of each switch by increasing the low temperature of each switch.

2. The thermally managed power supply of claim 1 including:
   a filter configured to suppress voltage transients caused by the application of voltages at the output port produced by the thermal controller opening and closing the one or more switches.

3. The thermally managed power supply of claim 1 including one or more temperature sensors disposed to provide an indication of the temperature differential that occurs between a low temperature and a high temperature of each switch, wherein the thermal controller adjusts the opening and closing of the one or more switches in response to the indication of the temperature.

4. The thermally managed power supply of claim 1 including one or more current sensors configured to provide an indication of a current flowing through the one or more switches, wherein the thermal controller adjusts the opening and closing of the one or more switches in response to the indication of the current.

5. The thermally managed power supply of claim 1, wherein the thermal controller is configured to open and close a single switch in a rapid succession of short pulses that are ineffective.

6. The thermally managed power supply of claim 1, wherein the thermal controller is configured to open and close two switches in an alternating manner to apply canceling pulses.

7. A method for operating a power supply, the method comprising:
generating power with a power source;
switchably coupling the power source to an output of the power supply;
opening and closing one or more switches to generate a voltage waveform at the output port; and
opening and closing the one or more switches to reduce a temperature differential that occurs between a low temperature and a high temperature of each switch by increasing the low temperature of each switch.

8. The method of claim 7, including filtering voltages at the output port that are produced by the thermal controller opening and closing the one or more switches.

9. The method of claim 7, including sensing a temperature of the one or more switches and using the temperature as feedback to control the opening and closing of the one or more switches.

10. The method of claim 7, including sensing current flowing through the one or more of the switches and using the sensed current as feedback to control the opening and closing of the one or more switches.

11. The method of claim 7, including opening and closing the one or more switches in a rapid succession of short and ineffective pulses.

12. The method of claim 7, including opening and closing the one or more switches in an alternating manner to apply canceling pulses.

13. A thermally managed power supply comprising:
a power source;
an output port configured to couple to an electrical load;
one or more switches coupled to the power source and the output port;
a waveform controller configured to open and close one or more switches to generate a voltage waveform at the output port;
means for heating the one or more switches to reduce a temperature differential that occurs between a low temperature and a high temperature of each switch by increasing the low temperature of each switch.

14. The thermally managed power supply of claim 13 including:
a filter configured to suppress voltage transients caused by the application of voltages at the output port produced by the thermal controller opening and closing the one or more switches.

15. The thermally managed power supply of claim 13 including one or more temperature sensors disposed to provide an indication of the temperature differential that occurs between a low temperature and a high temperature of each switch, wherein the thermal controller adjusts the opening and closing of the one or more switches in response to the indication of the temperature.

16. The thermally managed power supply of claim 13 including one or more current sensors configured to provide an indication of a current flowing through the one or more switches, wherein the thermal controller adjusts the opening and closing of the one or more switches in response to the indication of the current.

17. The thermally managed power supply of claim 13, wherein the thermal controller is configured to open and close a single switch in a rapid succession of short pulses that are ineffective.

18. The thermally managed power supply of claim 13, wherein the thermal controller is configured to open and close two switches in an alternating manner to apply cancelling pulses.

* * * * *